(12) United States Patent
Nakamura et al.

(10) Patent No.: US 8,891,029 B2
(45) Date of Patent: Nov. 18, 2014

(54) DISPLAY DEVICE AND TELEVISION RECEIVER

(75) Inventors: Shinichi Nakamura, Osaka (JP); Yoshikazu Ichinari, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/124,529

(22) PCT Filed: Apr. 2, 2012

(86) PCT No.: PCT/JP2012/058803
§ 371 (c)(1),
(2), (4) Date: Dec. 6, 2013

(87) PCT Pub. No.: WO2012/169267
PCT Pub. Date: Dec. 13, 2012

(65) Prior Publication Data
US 2014/0111706 A1   Apr. 24, 2014

(30) Foreign Application Priority Data

Jun. 7, 2011 (JP) ................................. 2011-127542
Dec. 20, 2011 (JP) ................................. 2011-278770

(51) Int. Cl.
*H04N 5/64* (2006.01)
*H05K 7/14* (2006.01)

(52) U.S. Cl.
CPC ... *H04N 5/64* (2013.01); *H05K 7/14* (2013.01)
USPC ....................... 348/843; 361/679.01; 361/829

(58) Field of Classification Search
USPC ............................... 361/679.01, 829; 348/843
See application file for complete search history.

(56) References Cited

U.S. PATENT DOCUMENTS

| 2007/0041212 A1* | 2/2007 | Cho et al. ....................... 362/561 |
| 2008/0204623 A1* | 8/2008 | Tanaka ............................ 349/58 |
| 2008/0298000 A1 | 12/2008 | Choi |
| 2010/0246104 A1* | 9/2010 | Park et al. ................. 361/679.01 |

FOREIGN PATENT DOCUMENTS

| CN | 101731006 A | 6/2010 |
| JP | 08-236950 A | 9/1996 |
| JP | 2005-072517 A | 3/2005 |
| JP | 2007-233927 A | 9/2007 |
| JP | 2008-164803 A | 7/2008 |

* cited by examiner

Primary Examiner — Hung Dang
Assistant Examiner — Sunghyoun Park
(74) Attorney, Agent, or Firm — Birch, Stewart, Kolasch & Birch, LLP

(57) ABSTRACT

The display device includes a display unit, a front cabinet 3, and a back cabinet 4. The front cabinet 3 includes a front surface part 31, a peripheral surface part 32, and a protruding plate part 322. The back cabinet 4 includes a screw insert hole 42 and an extension part 41. The front cabinet 3 and the back cabinet 4 are coupled by fastening of a tapping screw 5 which is inserted into a screw insertion hole 42 from the rear side and tapped and screwed to the peripheral surface part 32 and the protruding plate part 322 or a tip surface of the protruding plate part 322, and by fitting of the extension part 41 to a gap 324 between the peripheral surface part 32 and the protruding plate part 322.

8 Claims, 14 Drawing Sheets

DISPLAY DEVICE AND TELEVISION RECEIVER

CROSS-REFERENCE TO RELATED APPLICATIONS

This application is the national phase under 35 U.S.C. §371 of PCT International Application No. PCT/JP2012/058803 which has an International filing date of Apr. 2, 2012 and designated the United States of America.

FIELD

The present invention relates to a display device and a television receiver such as a liquid crystal television, a plasma television or the like.

BACKGROUND

To mount a back cabinet on a front cabinet of a display device, screw fixing is performed. When the front cabinet is integrally molded using a metal mold, screw fixing holes can be easily formed. However, when the front cabinet is extrusion-molded, increases in labor and costs are brought about because the screw fixing holes are formed by a separate process. An extrusion-molded product, in which the screw hole forming process is excluded and members are fastened by tapping screws, is disclosed in Japanese Patent Application Laid-open Publication No. 2007-233927.

SUMMARY

However, even if the screw hole forming process is excluded from the front cabinet manufacturing process, when the coupling between the front cabinet and the back cabinet by the tapping screws is not sufficient, the strength of the display device is lowered.

In consideration of the above-mentioned circumstances, it is an object of the present invention to provide a display device and a television receiver which can reduce the number of manufacturing processes and achieve an increase in strength.

A display device according to the present application includes a display unit having a display surface on a front side thereof, a front cabinet enclosing a peripheral edge part of the display unit, and a back cabinet covering a back side of the display unit, wherein the front cabinet includes a front surface part covering the peripheral edge part of the display surface, and a peripheral surface part which is formed on a rear side arround an outer peripheral edge of the front surface part to enclose an outer peripheral surface of the display unit, the display device is characterized in that: the front cabinet includes a protruding plate part located on an inside of the peripheral surface part, which is isolated from the peripheral surface part, and protrudes rearward from the front cabinet along a part or all of the peripheral surface part; the back cabinet includes a screw insert hole which faces between the peripheral surface part and the protruding plate part or a tip surface of the protruding plate part, and an extension part which faces an area between the peripheral surface part and the protruding plate part and extends forward; and the front cabinet and the back cabinet are coupled by fastening of a tapping screw which is inserted into the screw insertion hole from the rear side and tapped and screwed to the peripheral surface part and the protruding plate part or the tip surface of the protruding plate part, and by fitting of the extension part to a gap between the peripheral surface part and the protruding plate part.

In the display device according to the present application, a display unit, a front cabinet, and a back cabinet are included therein. The display unit has a display surface on a front side thereof. The front cabinet encloses a peripheral edge part of the display unit. The back cabinet covers a back side of the display unit. The front cabinet includes a front surface part, a peripheral surface part, and a protruding plate part. The front surface part covers the peripheral edge part of the display surface of the display unit. The peripheral surface part is formed on a rear side of the front surface part arround an outer peripheral edge thereof to enclose an outer peripheral surface of the display unit. The protruding plate part is located on an inside thereof which is isolated from the peripheral surface part, and protrudes rearward from the front cabinet along a part or all of the peripheral surface part. The back cabinet includes a screw insert hole and an extension part. The screw insert hole faces between the peripheral surface part and the protruding plate part or a tip surface of the protruding plate part. The extension part faces between the peripheral surface part and the protruding plate part and extends forward. The front cabinet and the back cabinet are coupled by fastening of a tapping screw and fitting of the extension part to a gap formed between the peripheral surface part and the protruding plate part. The tapping screw is inserted into the screw insertion hole from the rear side of the back cabinet and tapped and screwed to the peripheral surface part and the protruding plate part of the front cabinet or the tip surface of the protruding plate part.

The display device according to the present application is characterized in that: the protruding plate part includes a groove formed in the tip surface of the protruding plate part, the groove being substantially parallel to a tip of the peripheral surface part, and the front cabinet and the back cabinet are coupled by fastening of a tapping screw which is screwed to the groove of the protruding plate part.

In the display device according to the present application, a groove substantially parallel to a tip of the peripheral surface part is formed in the tip surface of the protruding plate part. The front cabinet and the back cabinet are coupled by fastening of a tapping screw which is screwed to the groove formed in the tip surface of the protruding plate part.

The display device according to the present application is characterized in that: the front cabinet includes a rib which protrudes inward from an inner surface of the peripheral surface part, and the protruding plate part protrudes from a rear surface of the rib.

In the display device according to the present application, a rib is protruded inward from an inner surface of the peripheral surface part of the front cabinet. The protruding plate part is protruded from a rear surface of the rib.

The display device according to the present application is characterized in that: the protruding plate part is so formed as to protrude between the peripheral surface part and the display unit from a rear surface of the front surface part.

In the display device according to the present application, the protruding plate part is formed so as to protrude between the peripheral surface part and the display unit from a rear surface of the front surface part.

The display device according to the present application is characterized in that: the extension part extends forward from an outer peripheral part of the back cabinet.

In the display device according to the present application, the extension part extends forward from an outer peripheral part of the back cabinet.

The display device according to the present application is characterized in that: the extension part is formed arround a part or all of the outer peripheral part of the back cabinet.

In the display device according to the present application, the extension part is formed arrond a part or all of the outer peripheral part of the back cabinet.

The display device according to the present application is characterized in that: the front cabinet is formed by extrusion molding.

In the display device according to the present application, the front cabinet is formed by extrusion molding.

A television receiver according to the present application includes: the display device according to the above; and a receiving unit which receives television broadcasting, wherein the display device display a video image of the television broadcasts received by the receiving unit.

In the television receiver according to the present application, the television receiver includes the display device according to the above, and a receiving unit which receives television broadcasts. The display device displays an image related to the television broadcasts received by the receiving unit.

According to the present application, it is possible to reduce the number of manufacturing processes and achieve an increase in strength with respect to the display device and the television receiver.

DETAILED DESCRIPTION

Hereinafter, a display device according to one embodiment of the present invention will be described with reference to the accompanying drawings illustrating the embodiments thereof. The display device according to the present embodiment includes, for example, a television receiver such as a liquid crystal television, a plasma television, a cellular phone capable of receiving one segment broadcasting or the like. Further, the display device according to the present embodiment includes a liquid crystal display of a personal computer, an automatic teller machine (ATM), a ticket vending machine, or the like, an organic electro luminescence (EL) display, a surface-conduction electron-emitter display (SED) or the like. Further, the display device according to the present embodiment includes a display of a smart phone, a tablet terminal or the like. Hereinafter, as an example of the display device, the television receiver will be described with illustration.

Meanwhile, the present invention is not specified to the following embodiments.

Embodiment 1

Figure 1:
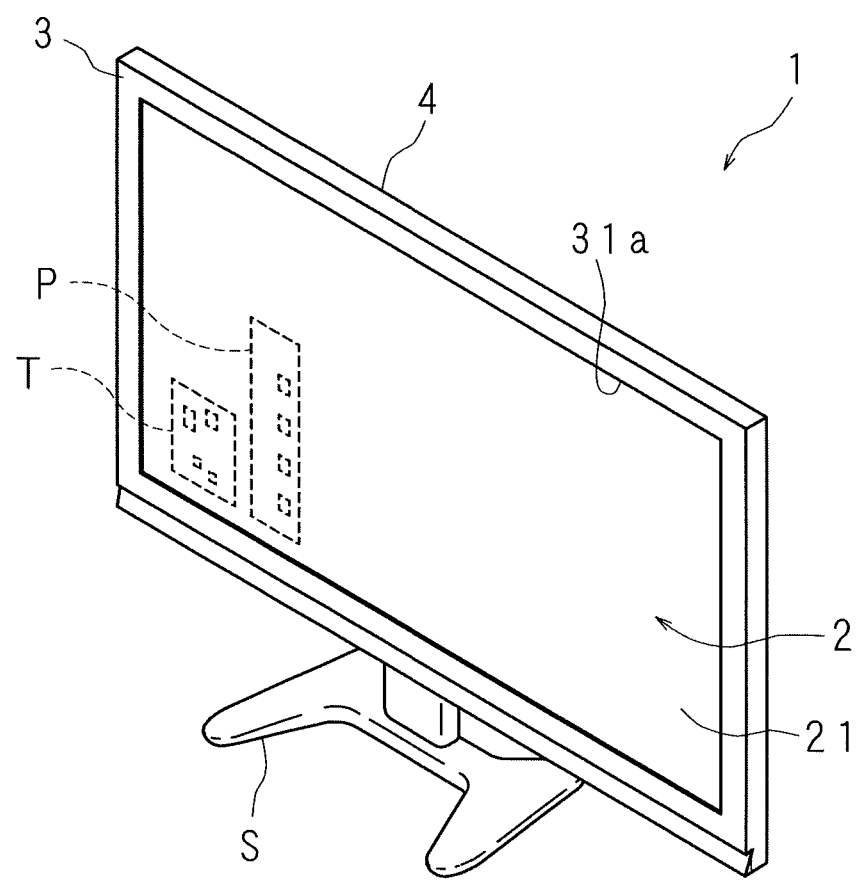
FIG. 1 is a schematic perspective view of a television receiver.

FIG. 1 is a schematic perspective view of a television receiver 1. Herein, when a viewer faces a display surface 21 of the television receiver 1 that displays an image, the viewer side of the display surface 21 will be referred to as a front side, which is the opposite side of the front side, will be referred to as a back or rear side. The display surface 21 has a laterally long and substantially rectangular shape, and from a viewer's position of facing the display surface 21, the right side of the display surface 21 in a longitudinal direction thereof will be referred to as right, and the left side thereof in the longitudinal direction will be referred to as left. Further, from a viewer's position of facing the display surface 21, the upper side of the display surface in a lateral direction thereof will be referred to as top, and the lower side thereof in the lateral direction will be referred to as bottom. FIG. 1 shows the television receiver 1 as seen obliquely from the front upper right.

The television receiver 1 includes a display unit 2, a front cabinet 3, a back cabinet 4, a receiving unit T, a power source P and a stand S. The display unit 2 includes a front peripheral edge part and an outer peripheral surface which are enclosed by the front cabinet 3 of the front side. The front cabinet 3 has an opening 31a formed therein with a laterally long rectangular shape and the display surface 21 of the display unit 2 is exposed to the opening 31a. The back cabinet 4 of the rear side has a substantially flat plate shape and covers the display unit 2 and a part of the front cabinet 3 from the rear side.

The receiving unit T and the power source P are mounted between the display unit 2 and the back cabinet 4. The receiving unit T receives television broadcasts. The power source P supplies power to the television receiver 1. The television receiver 1 displays an image related to the television broadcasts received by the receiving unit T on the display surface 21 of the display unit 2. The stand S supports the display unit 2, the front cabinet 3 and the back cabinet 4 in an upright state.

Figure 2:
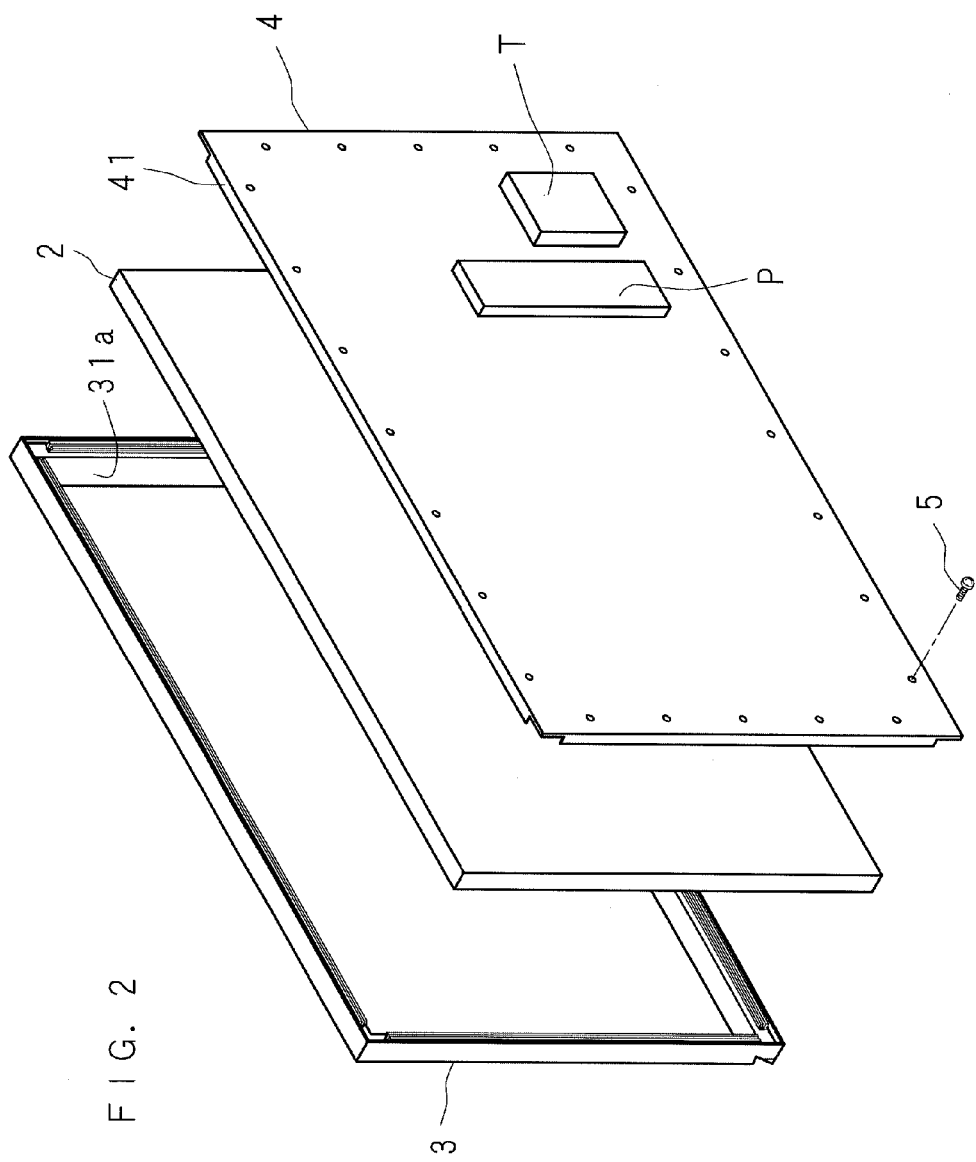
FIG. 2 is a schematic exploded perspective view of one example of a display unit, a front cabinet and a back cabinet.

FIG. 2 is a schematic exploded perspective view of one example of the display unit 2, the front cabinet 3 and the back cabinet 4. FIG. 2 shows the display unit 2, the front cabinet 3 and the back cabinet 4 as seen obliquely from the upper rear right.

The display unit 2 has the display surface 21 formed on the front thereof to display a video image and is formed in a laterally long rectangular parallelepiped shape taken as a whole. The display unit 2 may be fixed onto the front cabinet 3 or the back cabinet 4 through a bezel (not shown), or may be sandwiched between the front cabinet 3 and the back cabinet 4 without using a bezel.

The display unit 2 includes a liquid crystal panel and a backlight, for example. The backlight may be an edge light type or a direct type. When the backlight is an edge light type, light sources are installed on the inner surface of the front cabinet 3, and the heat generated from the light sources is transferred to the front cabinet 3. When the backlight is a direct type, the light sources are disposed on the rear side of the liquid crystal panel, and the display unit 2 is configured such that the heat generated from the light sources is transferred to the front cabinet 3 or the back cabinet 4 through a bezel, for example.

When the display unit 2 is a plasma display, organic EL display, or the like, for example, the display unit 2 is configured such that the heat generated from the display is transferred to the front cabinet 3 or the back cabinet 4.

The front cabinet 3 or the back cabinet 4 may be made of metal or resin. When using metal, the front cabinet 3 or the back cabinet 4 may be made of aluminum, iron, copper, or the like, for example. The front cabinet 3 may be formed by extrusion molding, for example. When the back cabinet 4 is made of metal, it may be formed by pressing, for example. When the front cabinet 3 or the back cabinet 4 is made of iron, copper, or the like, electrogalvanizing, for example, may be conducted in view of corrosion resistance, aesthetics or the like.

Figure 3:
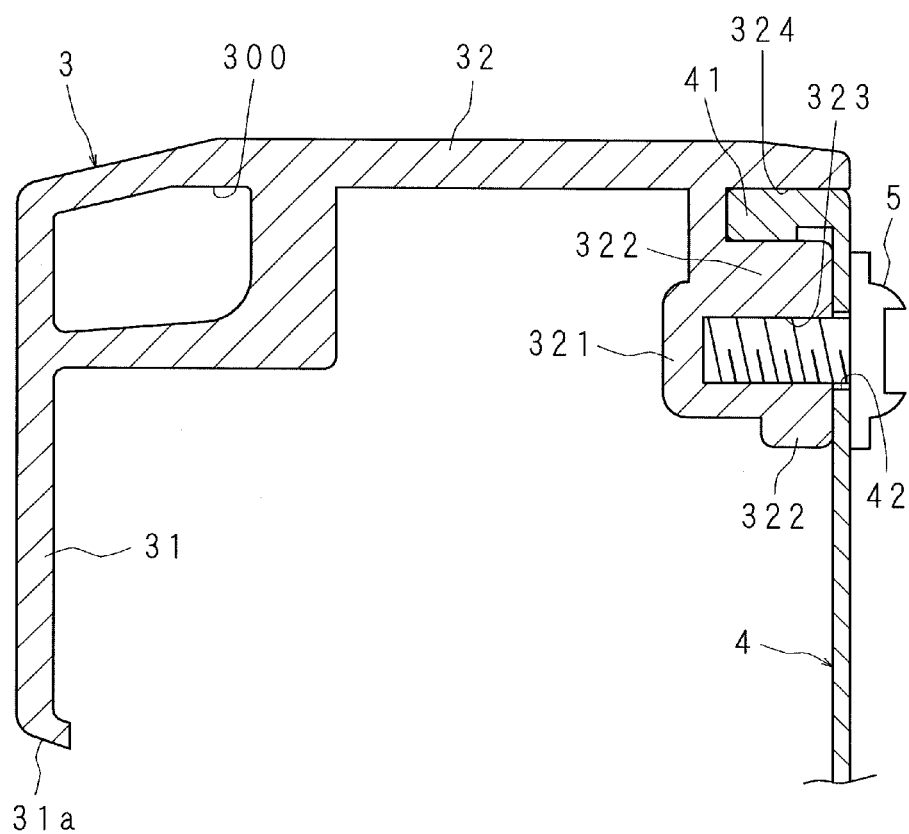
FIG. 3 is a cross-sectional view of one example of the front cabinet and the back cabinet.

FIG. 3 is a cross-sectional view of an example of the front cabinet 3 and the back cabinet 4. FIG. 3 shows a part of the upper cross section of the front cabinet 3 and the back cabinet 4 cut in a plane substantially parallel to the normal line and the vertical direction of the display surface 21.

The front cabinet 3 includes a front surface part 31 and a peripheral surface part 32.

The front surface part 31 is a rectangular frame shaped member covering the peripheral edge part of the display surface 21 of the display unit 2. The front surface part 31 has a substantially rectangular opening 31*a* formed therein, and a user can see a video image displayed on the display surface 21 of the display unit 2 through the opening 31*a*.

The peripheral surface part 32 is a cylindrical member protruding rearward from the outer peripheral edge of the front surface part 31. The peripheral surface part 32 is formed in a rectangular frame shape as seen from the rear side, and encloses and covers the peripheral surface of the display unit 2.

An elongated hollow hole 300, which has an inner surface substantially parallel to outer surfaces of the front surface part 31 and the peripheral surface part 32, is formed at a front corner of the front cabinet 3 where the front surface part 31 and the peripheral surface part 32 meet. The longitudinal direction of the hole 300 is substantially perpendicular to the normal line of the display surface 21 and the normal line of the peripheral surface of the display unit 2.

As shown in FIG. 3, when cutting the front cabinet 3 in a plane substantially perpendicular to the longitudinal direction of the hole 300, the hole 300 has a cross section of a rectangular shape.

The peripheral surface part 32 is provided with ribs 321 formed so as to protrude inward from the inner surface slightly forward from a tip thereof. A total of four ribs 321 are formed on the peripheral surface part 32 respectively on the top, bottom, left and right surfaces. Each rib 321 is provided with a protruding plate part 322 which protrudes rearward from the rear surface along the peripheral surface part 32 or substantially parallel to the peripheral surface part 32. The protruding plate part 322 has an elongated plate shape and includes a slit groove 323 of a slit shape, which extends in a longitudinal direction of the protruding plate part 322, formed at the substantial center of a tip surface thereof. Further, a peripheral surface groove 324, which is a gap or a void, is formed between the protruding plate part 322 and the peripheral surface part 32. In the slit groove 323 or the peripheral surface groove 324, the depth of the groove, the width of the groove, and the shape of the cross section, or the like, may be identical or different from each other.

The back cabinet 4 is a rectangular plate-shaped member that covers the display unit 2 and a part of the front cabinet 3 from the rear side. The back cabinet 4 includes an extension part 41 extending forward from the outer peripheral end thereof facing the peripheral surface groove 324 of the front cabinet 3. In FIG. 3, the shape of the cross section of the extension part 41 and the outer periphery of the back cabinet 4 is formed in a substantially L shape. The extension part 41 is formed arround the outer peripheral end of the back cabinet 4. The length of the extension part 41 in an extending direction thereof is substantially equal to the depth of the peripheral surface groove 324. The thickness of the extension part 41 is thin at the base of the extension part 41 and thick at the tip portion thereof. The thickness of the tip portion of the extension part 41 is equal to the width of the peripheral surface groove 324 or greater than the width of the peripheral surface groove 324. The tip portion of the extension part 41 and the outer part of the thin portion of the extension part 41 are formed to fit in the peripheral surface groove 324. The extension part 41 extends substantially parallel to the longitudinal direction of the peripheral surface groove 324 (the direction at substantially right angles to the paper surface of FIG. 3). Therefore, the outer surface of the extension part 41 and the inner surface of the peripheral surface groove 324 are in contact with each other in a rail shape, excluding the inner portion of the thin portion of the extension.

Further, the extension part 41 may be formed in a wedge shape tapered toward the front end thereof. Alternatively, the thickness of the extension part 41 may be constant. The length of the extension part 41 in the extension direction may be equal to or different from the length of the peripheral surface groove 324.

Further, the number of the extension parts 41 corresponding to each of the top, bottom, left and right surfaces of the peripheral surface part 32 may be more than one. That is, the extension part 41 may be formed intermittently along a part of the outer extension part of the back cabinet 4, or may be formed successively along the whole of the outer extension part of the back cabinet 4.

The back cabinet 4 includes a circular screw insert hole 42 formed at a position facing the slit groove 323 of the front cabinet 3. The number of screw insert holes 42 corresponding to one slit groove 323 is seven or five in the example of FIG. 2. However, the number of screw insert holes 42 corresponding to one slit groove 323 is not specified thereto, but may be other than seven or five. When the corresponding slit groove 323 is different, the number of the screw insert holes 42 corresponding to one slit groove 323 may be different.

The size of the outer diameter of the shank of the tapping screw 5 is set to a size slightly greater than the width of the slit groove 323. Alternatively, the width of the slit groove 323 is set to a width slightly narrower than the outer diameter of the tapping screw 5.

By screwing the tapping screw 5 into the slit groove 323 from the rear side of the screw insert hole 42, the back cabinet 4 is coupled to the front cabinet 3. Therefore, the size of the inner diameter of the screw insert hole 42 is a size suitable for the shank of the tapping screw 5 to be inserted therein. The tapping screw 5 is made of a material such as iron, aluminum, stainless steel, or the like. The head portion of the tapping screw 5 may be any one of a pan head, flat head, truss head, or the like, and is not specified to a specific shape.

Next, the outline of an assembling method of the television receiver 1 will be described.

The front cabinet 3 is put on a horizontal surface with the front side of the front cabinet 3 facing down. The display unit 2 is superposed the front cabinet 3. When the display unit 2 is fixed to the front cabinet 3 through a bezel, the display unit 2 and the bezel are fixed with screws.

The back cabinet 4 is positioned with respect to the front cabinet 3, in such a way that the peripheral surface groove 324 of the front cabinet 3 and the extension part 41 of the back cabinet 4 corresponding to the peripheral surface groove 324 face each other. The front cabinet 3 and the back cabinet 4 are coupled by fitting the extension part 41 into the peripheral surface groove 324.

The tapping screw 5 is inserted from the rear side into the screw insert hole 42 of the back cabinet 4, and the shank of the tapping screw 5 is tapped and screwed to the slit groove 323.

When the display unit 2 is sandwiched between the front cabinet 3 and the back cabinet 4 without using the bezel, the display unit 2 is pressed to be sandwiched between the front cabinet 3 and the back cabinet 4 by fitting of the extension part 41 into the peripheral surface groove 324 and fastening of the tapping screw 5 into the slit groove 323.

When the display unit 2 is fixed to the front cabinet 3 and/or the back cabinet 4 using the bezel, the display unit 2 may or may not be sandwiched between the front cabinet 3 and the back cabinet 4.

As the size of the television receiver becomes larger, the mold cost of the cabinet tends to increase. Meanwhile, when the front cabinet 3 is formed by extrusion molding of a metal material for the purpose of cost reduction, it is necessary to create extra holes for screw fixing.

According to the television receiver 1, the front cabinet 3 and the back cabinet 4 are coupled by the tapping screw 5 screwed to the slit groove 323 of the front cabinet 3. The slit groove 323 has a structure that can be formed by extrusion molding. When coupling a front cabinet 3 that is extrusion-molded and a back cabinet 4 that is molded by pressing using the tapping screw 5, a mold and tapping are not necessary, and cost reduction can be achieved.

The number of the tapping screws 5 screwed to the slit groove 323 and the fastening position thereof are not particularly specified. Because the slit grooves 323 are successive in the longitudinal direction, the number of the tapping screws 5 and the fastening position thereof can be changed freely depending on the design change of the cabinets.

According to the television receiver 1, the front cabinet 3 and the back cabinet 4 are coupled as the extension part 41 of the back cabinet 4 is fitted into the peripheral surface groove 324 of the front cabinet 3. The coupling strength of the front cabinet 3 and the back cabinet 4 can be increased by fitting of the extension part 41 into the peripheral surface groove 324, in addition to the coupling of the front cabinet 3 and the back cabinet 4 by screwing of the tapping screw 5.

According to the television receiver 1, a path along which heat is transferred between the front cabinet 3 and the back cabinet 4 includes a contact part between the protruding plate part 322 and the back cabinet 4, as well as the tapping screw 5. Further, the path along which heat is transferred between the front cabinet 3 and the back cabinet 4 also includes the contact part between the extension part 41 of the back cabinet 4 and the peripheral surface groove 324 of the front cabinet 3. Accordingly, the quantity of the heat transferred between the front cabinet 3 and the back cabinet 4 increases by as much as that provided by the contact area between the extension part 41 and the peripheral surface groove 324, compared with the case of the simple screw fixing of the front cabinet 3 and the back cabinet 4. Therefore, the heat generated from the display unit 2 is transferred to the back cabinet 4 or the front cabinet 3 respectively, after the heat is first transferred to the front cabinet 3 or the back cabinet 4. Thus, heat release from the whole of the cabinets becomes possible, such that the radiation efficiency rises.

Further, in order to increase the contact area between the front cabinet 3 and the back cabinet 4, a part extending inward from the rear portion of the protruding plate part 322, for example, may be formed in a state contacting the back cabinet 4. Thus, the contact area between the front cabinet 3 and the back cabinet 4 is increased further, such that the radiation efficiency can be raised further.

In the foregoing description, the slit groove 323 is formed in the protruding plate part 322. However the slit groove 323 may not be formed in the protruding plate part 322.

Figure 4:
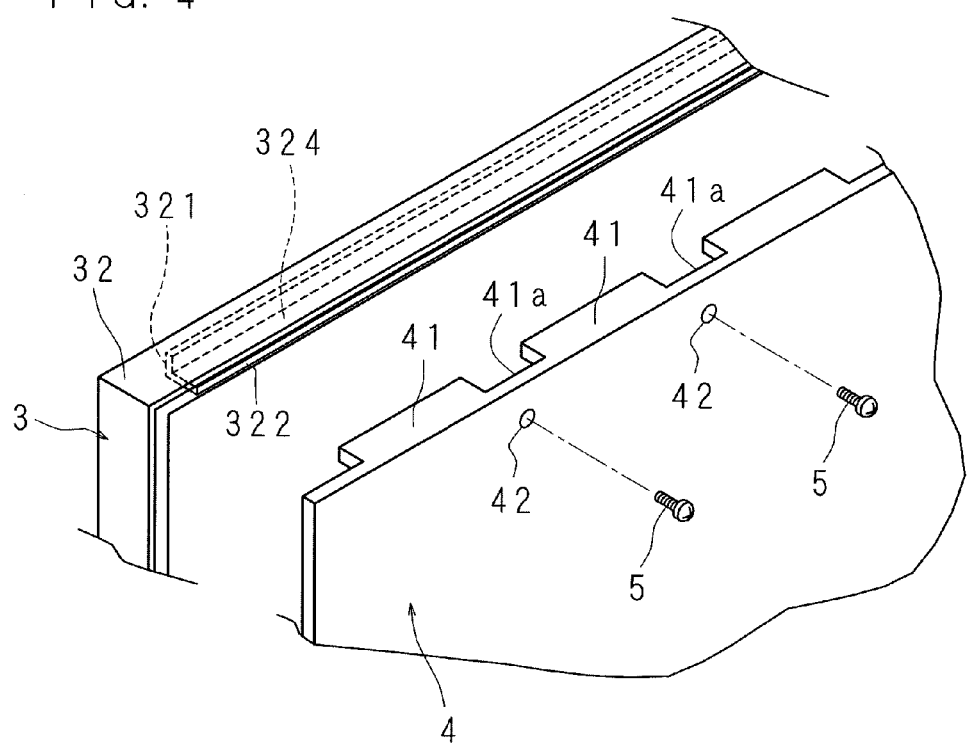
FIG. 4 is a schematic exploded perspective view of one example of the front cabinet and the back cabinet.

FIG. 4 is a schematic exploded perspective view of one example of the front cabinet 3 and the back cabinet 4. FIG. 4 shows a part of the front cabinet 3 and the back cabinet 4 as seen obliquely from the upper rear side, while not showing the display unit 2.

The extension parts 41 of the back cabinet 4 have a plurality of notches 41a, and screw insert holes 42 which are formed at the positions corresponding to the notch 41a parts. The extension parts 41 and the screw insert holes 42 are arranged in a straight-line, facing the peripheral surface groove 324. The extension parts 41 are fitted into the peripheral surface groove 324, and the tapping screws 5 are inserted into the screw insert holes 42 from the rear side and screwed to the peripheral surface groove 324.

The number of the notches 41a formed in the extension parts 41 is not particularly specified. The number of the notches 41a may be made to be more than that shown in FIG. 4, and the shape of the extension parts 41 may be made in an alternate convexo-concave shape such as the teeth of a comb or the teeth of a saw.

Because the width of the protruding plate part 322 can be narrowed by the width of the slit groove 323 by not forming the slit groove 323, it is possible to narrow the frame of the television receiver 1.

When the front cabinet 3 is made of a resin material by extrusion molding, the slit groove 323 may be or may not be formed in the protruding plate part 322. When the slit groove 323 is not formed in the protruding plate part 322, a tapping screw 5, which has a sharp screw point and is made of a metal material harder than resin, is used.

Further, in FIG. 4, the number of ribs 321 corresponding to the top, bottom, left and right surfaces of the peripheral surface part 32 is equal to one. The length of the rib 321 is a little shorter than that of the long axis direction of the top, bottom, left and right of the peripheral surface part 32. Further, the length of the long axis direction of the protruding plate part 322 corresponding to each of the top, bottom, left and right surfaces of the peripheral surface part 32 is also a little shorter than that of the long axis direction of the top, bottom, left and right of the peripheral surface part 32. However, as in the extension part 41 of FIG. 4, notches may be formed in the rib 321 and the protruding plate part 322. In this case, the cabinet has a plurality of ribs 321 and protruding plate parts 322 corresponding to the respective surfaces of the top, bottom, left and right of the peripheral surface part 32. That is, the ribs 321 and the protruding plate parts 322 may be formed intermittently along a part of the peripheral surface part 32, or may be formed successively arround the whole of the peripheral surface part 32.

In the foregoing description, the back cabinet 4 covers a part of the front cabinet 3 from the rear side. However, the back cabinet 4 may cover the whole of the front cabinet 3 from the rear side. For example, the outer peripheral shape and size of the back cabinet 4 as seen from the rear side are made substantially the same as the outer peripheral shape and size of the front cabinet 3 as seen from the front side. In such a case, the outer periphery of the front surface part 31 as seen from the front side and the outer periphery of the back cabinet 4 as seen from the rear side substantially match. The extension part 41 is the same as described above in that it extends rearward so as to face the peripheral surface groove 324. The outer peripheral edge part of the back cabinet 4 is, however, provided with a flange which is formed outward of the extension part 41 and has a width of substantially the same as the thickness of the peripheral surface part 32. In addition, the horizontal cross section near the outer peripheral edge part of the back cabinet 4 and the extension part 41 or the vertical cross section substantially parallel to the normal line of the display surface 21 is formed in a substantially T shape.

Embodiment 2

Embodiment 2 relates to an example in which a protruding plate part 322 is formed rearward from a front surface part 31 of a front cabinet 3.

Figure 5:
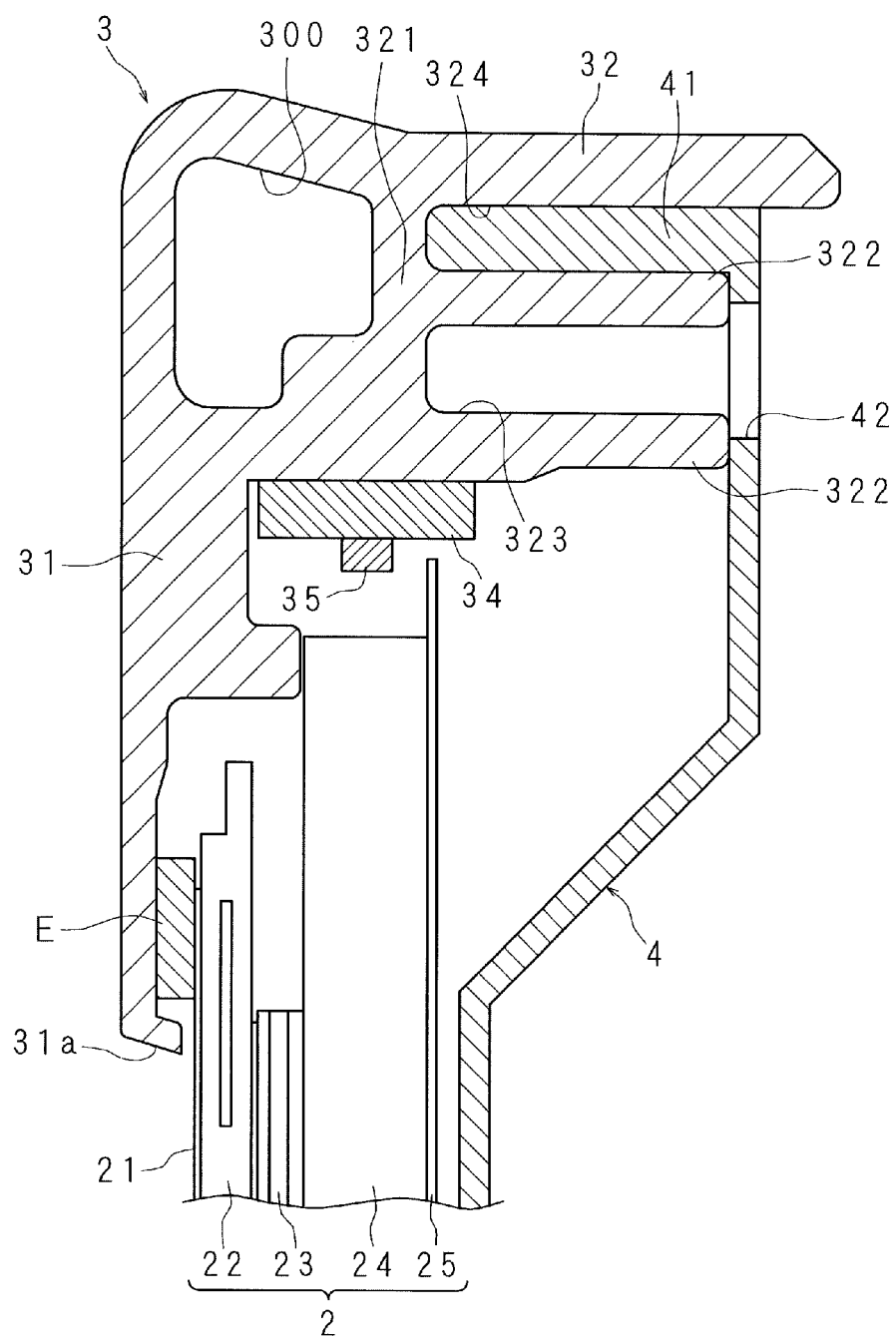
FIG. 5 is a cross-sectional view of one example of a display unit, a front cabinet and a back cabinet.

FIG. 5 is a cross-sectional view of one example of a display unit 2, a front cabinet 3 and a back cabinet 4. FIG. 5 shows a part of the upper cross section of the cross sections in which the display unit 2, the front cabinet 3 and the back cabinet 4 are cut in a plane parallel to the normal line of the display surface 21 and the vertical direction. In FIG. 5, a tapping screw 5 is not illustrated.

The display unit 2 has a display surface 21 for displaying a video image on the front thereof and is formed in a laterally long rectangular parallelepiped shape taken as a whole. The display unit 2 includes a liquid crystal panel 22, a diffusion sheet 23, a light guide plate 24 and a reflection sheet 25. These members are laminated in the order of the liquid crystal panel 22, the diffusion sheet 23, the light guide plate 24 and the reflection sheet 25 from the front side to the rear side.

The liquid crystal panel 22 of the display unit 2 displays the image using irradiation light from the rear side by a so-called edge light type backlight. Further, the liquid crystal panel 22 may use irradiation light by a direct type backlight.

The light guide plate 24 is formed in a rectangular parallelepiped shape and is made of a transparent resin with excellent light transmittance such as acryl, polycarbonate or the like. The light guide plate 24 has a surface on which a rough coarse surface such as a dotted pattern or the surface of a pear coat, for example, is formed. The light guide plate 24 and a light emitting diode (LED) 35 to be described later are positioned so that light from the LED 35 can be incident on the peripheral surface of the light guide plate 24.

The reflection sheet 25 is made of a white resin with good reflexibility, reflects the light incident on the light guide plate 24, and has a function of returning the reflected light to the light guide plate 24. Paint with good reflexibility may be coated on the surface of the reflection sheet 25. The light guide plate 24 and the reflection sheet 25 uniformize the incident light from the LED 35 and emit it to the diffusion sheet 23.

The diffusion sheet 23 is made into a plate-shaped member made of resin in which light scattering particles are dispersed and blended. The diffusion sheet 23 diffuses the light emitted to the front side from the light guide plate 24, and emits the light having a uniformized luminance distribution on the liquid crystal panel 22.

The liquid crystal panel 22 modulates the irradiation light from the diffusion sheet 23, and displays a video image on the display surface 21 of the front side. Further, the liquid crystal panel 22 may have a configuration in which known optical sheet materials such as a prism sheet, a polarized sheet or the like are properly laminated as necessary.

Further, the front peripheral edge part of the liquid crystal panel 22 is pressed by the front cabinet 3 through an elastic member E. The elastic member E may be high-density microcell polyurethane foam, for example.

The outer surface of the front corner on which the front surface part 31 and a peripheral surface part 32 of the front cabinet 3 meet is gently curved. The thickness of the front surface part 31 of the front corner is thicker than the other parts, and the front cabinet 3 has adequate robustness due to this thick front corner.

The front cabinet 3 includes the protruding plate part 322. The protruding plate part 322 is formed so as to protrude between the peripheral surface part 32 and the display unit 2 along the peripheral surface part 32 rearward from the rear surface of the front surface part 31, or substantially parallel to the peripheral surface part 32. The position of the rear tip of the protruding plate part 322 is more forward than the position of the rear tip of the peripheral surface part 32. The protruding plate part 322 is formed in an elongated plate shape, and a total of four protruding plate part 322 are provided so as to correspond to the respective top, bottom, left and right sides of the front surface part 31. A slit groove 323 extending substantially parallel to the tip of the peripheral surface part 32 is formed in the tip surface of the protruding plate part 322. Further, a peripheral surface groove 324, which is a gap or a void, is formed between the protruding plate part 322 and the peripheral surface part 32.

Further, the ribs 321 and the protruding plate parts 322 may be formed intermittently along a part of the peripheral surface part 32, or successively along the whole of the peripheral surface part 32.

Each of the bases of the protruding plate parts 322 facing respectively the upper surface part and the lower surface part of the light guide plate 24 is provided with one screw-fixed LED substrate 34 made of aluminum. The LED substrate 34 is formed in an elongated rectangular shape substantially parallel to the longitudinal direction of the peripheral surface of the light guide plate 24. The longitudinal direction of the LED substrate 34 is also substantially the same as a direction orthogonal to the normal line of the peripheral surface of the light guide plate 24 and the normal line of the display surface 21.

Further, the LED substrate 34 may be adhered to the base of the rib 321 by double-sided tape with high thermal conductivity. Further, the LED substrate 34 may be installed on the base of the rib 321 facing respectively each side surface of the two left and right surfaces of the light guide plate 24, and may be installed on the base of the rib 321 facing respectively the peripheral surfaces of the four top, bottom, left and right surfaces of the light guide plate 24.

The LED substrate 34 includes a plurality of LEDs 35 mounted thereon so as to be arranged in a direction substantially parallel to the longitudinal direction of the LED substrate 34. The LED 35 is disposed substantially at the center of the upper cross section of FIG. 5.

Further, the LED 35 is one example of a light source that may be used to emit light to the light guide plate 24, however, the light source may be, for example, an electric bulb, hot-cathode fluorescent lamp, electro luminescence lamp, or cold-cathode tube.

An elongated hole 300 is formed at the front corner of the front cabinet 3, which is substantially parallel to the side direction of the corner. Alternatively, the hole 300 extends substantially parallel to the arrangement direction of the LEDs 35. When cutting the front cabinet 3 in a plane substantially perpendicular to the longitudinal direction of the hole 300, the shape of the hole 300 is substantially a polygon having an inner surface substantially parallel with the outer surface of the front cabinet 3. For instance, in the example of FIG. 5, the outer surface of the peripheral surface part 32 protrudes upward from the rear side to the front side, and the inner surface upward of the hole 300 is inclined upward from the rear side to the front side. In the example of FIG. 5, the inner surface of the hole 300 of the rear and lower side near the LED substrate 34 protrudes inward of the hole 300. In the example of FIG. 5, the cross section shape of the hole 300 is substantially a hexagon with a substantially quadrangular corner protruding inward. Therefore, the volume of the hole 300 part of the rear and lower side near the LED substrate 34 is smaller than that of the other portions of the hole 300.

Further, the shape of the hole 300 as cut in a plane substantially perpendicular to the longitudinal direction may be any one of a polygon, circle, ellipse, irregular shape or the like. Further, the number of holes 300 is not specified to one, but a plurality of holes 300 may be formed in the direction substantially identical to the arrangement direction of the LEDs 35.

The extension part 41 of the back cabinet 4 extends forward so as to rim the outer peripheral end of the back cabinet 4 facing the peripheral surface groove 324 along the peripheral surface groove 324. The thickness of the extension part 41 is equal to the width of the peripheral surface groove 324 or greater than the width of the peripheral surface groove 324, and the extension part 41 is formed to be able to fit in the peripheral surface groove 324. In FIG. 5, the thickness of the extension part 41 is drawn thin for the purpose of illustration. The extension part 41 extends parallel to the longitudinal direction of the peripheral surface groove 324.

The back cabinet 4 is coupled to the front cabinet 3 by screwing the tapping screw 5 into the slit groove 323 from the rear side of the screw insert hole 42. Further, the back cabinet 4 is coupled to the front cabinet 3 by fitting the extension part 41 in the peripheral surface groove 324.

Further, the extension part 41 may be formed intermittently arround a part of the outer peripheral edge part of the back cabinet 4, or may be formed successively arround the whole of the outer peripheral edge part of the back cabinet 4.

Next, an outline of the assembling method of the television receiver 1 will be described.

The front cabinet 3 is put on a horizontal surface with the front side of the front cabinet 3 facing down. The liquid crystal panel 22, the diffusion sheet 23, the light guide plate 24 and the reflection sheet 25 are laminated in this order on the front cabinet 3.

The back cabinet 4 is positioned with respect to the front cabinet 3 so that the extension part 41 of the back cabinet 4 faces the peripheral surface groove 324 of the front cabinet 3. The extension part 41 is fitted in the peripheral surface groove 324, and the front cabinet 3 and the back cabinet 4 are coupled. The tapping screw 5 is inserted into the screw insert hole 42 of the back cabinet 4 from the rear side, and the shank of the tapping screw 5 is screwed to the slit groove 323.

According to the television receiver 1, the LED 35, which functions as a heating element, is installed in the front cabinet 3. The protruding plate part 322 is installed at a position near the LED 35, whereby the heat from the LED 35 can be transmitted quickly to the back cabinet 4. Thus, it is possible to increase the effective thermal radiance of the whole cabinets.

According to the television receiver 1, the hole 300 is formed at the front corner of the front cabinet 3 where the user frequently touches. When the front cabinet 3 is made of metal, for example, the hole 300 is occupied by air whose thermal conductivity is less than that of metal. Therefore, the hole 300 can reduce the flow rate of the heat which is transferred from the LED 35 to the front corner of the front cabinet 3. Therefore, the hole 300 has such an effect that the user barely feels any heat when he or she touches the front corner of the front cabinet 3.

In addition, when the hole 300 is formed in the front cabinet 3, it is possible to reduce raw materials by as much as that of the volume of the hole 300.

Further, a heat insulating material with low thermal conductivity may be used to fill in the hole 300. Heat insulating materials with low thermal conductivity such as glass fiber, rock wool, urethane foam, phenol foam, cellulose fiber, sheep wool or the like, may be used.

In the foregoing description, the slit groove 323 is formed in the protruding plate part 322. However, the slit groove 323 may not be formed. As illustrated in FIG. 4, the extension part 41 and the screw insert hole 42 may be arranged in a straight-line facing the peripheral surface groove 324. Thus, the extension part 41 is fitted in the peripheral surface groove 324, and the tapping screw 5 is screwed into the peripheral surface groove 324.

If the slit groove 323 is not formed, the width of the protruding plate part 322 can be narrowed by the width of the slit groove 323, such that it contributes to the narrowing of the frame of the television receiver 1. When the slit groove 323 is not formed, the width of the protruding plate part 322 excluding the slit groove 323 may be narrowed further.

Embodiment 2 is as described above, and other than that is the same as embodiment 1, such that the corresponding parts have the same reference numbers, and a detailed description, actions and effects thereof will be omitted.

Embodiment 3

Embodiment 3 relates to a structure in which a back cabinet 4 is suspended from an upper peripheral surface part 32 of a front cabinet 3. The back cabinet 4 is temporarily fixed to the front cabinet 3 by suspending it from the peripheral surface part 32. Therefore, it is not necessary for a worker to press the back cabinet 4 by hand to prevent it from moving, when he or she screw-fixes the back cabinet 4 to the front cabinet 3 or the display unit 2. Accordingly, the structure in which the back cabinet 4 is suspended from the front cabinet 3 improves the assembly work efficiency of the television receiver 1.

Figure 6:
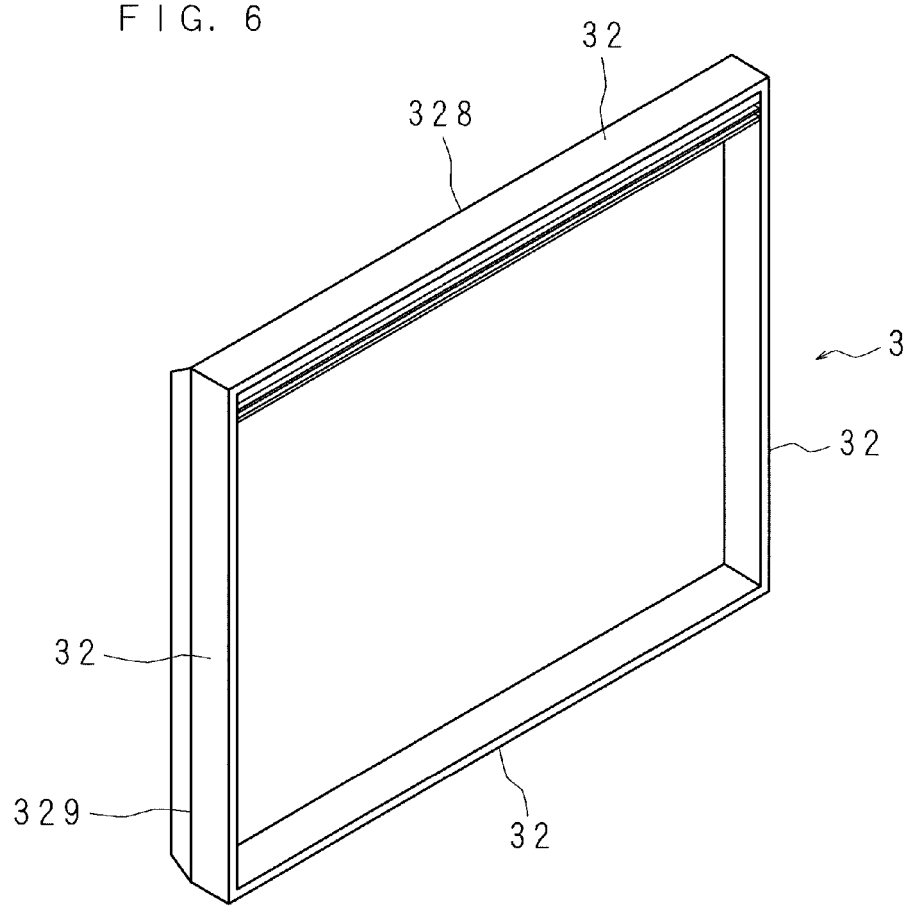
FIG. 6 is a schematic perspective view of a television receiver.

FIG. 6 is a schematic perspective view of the front cabinet 3. FIG. 6 shows the front cabinet 3 as seen obliquely from the upper rear left. The front cabinet 3 is provided with a space formed therein in which the display unit 2 of a substantially rectangular parallelepiped shape is housed. A part of the space in which the display unit 2 is housed has a rectangular shaped opening formed on the rear side of the front cabinet 3. The outer periphery of the front cabinet 3 includes cylindrical peripheral surface parts 32. The outer periphery of the front cabinet 3 is formed in a rectangular shape as seen from the rear face.

The lower peripheral surface part 32 is flat and substantially horizontal. On the other hand, the upper peripheral surface part 32 is formed in a roof shape having a ridge 328 substantially parallel with the longitudinal direction of the peripheral surface part 32. The length from the ridge 328 to the rear end is longer than the length from the ridge 328 to the front end. In the upper peripheral surface part 32, the portion from the ridge 328 to the rear end is substantially horizontal, while the portion from the ridge 328 to the front end is inclined toward the front side.

The peripheral surface part 32 of the left and right sides is formed in a shape having a ridge 329 substantially parallel with the short side of the outer periphery of the front cabinet 3. In the peripheral surface part 32 of the sides, the length from the ridge 329 to the rear end is longer than the length from the ridge 329 to the front end. The ridge 328 of the peripheral surface part 32 of the upper side and the ridge 329 of the peripheral surface part 32 of the left and right sides are consecutive at the upper corner of the front cabinet 3.

Figure 7:
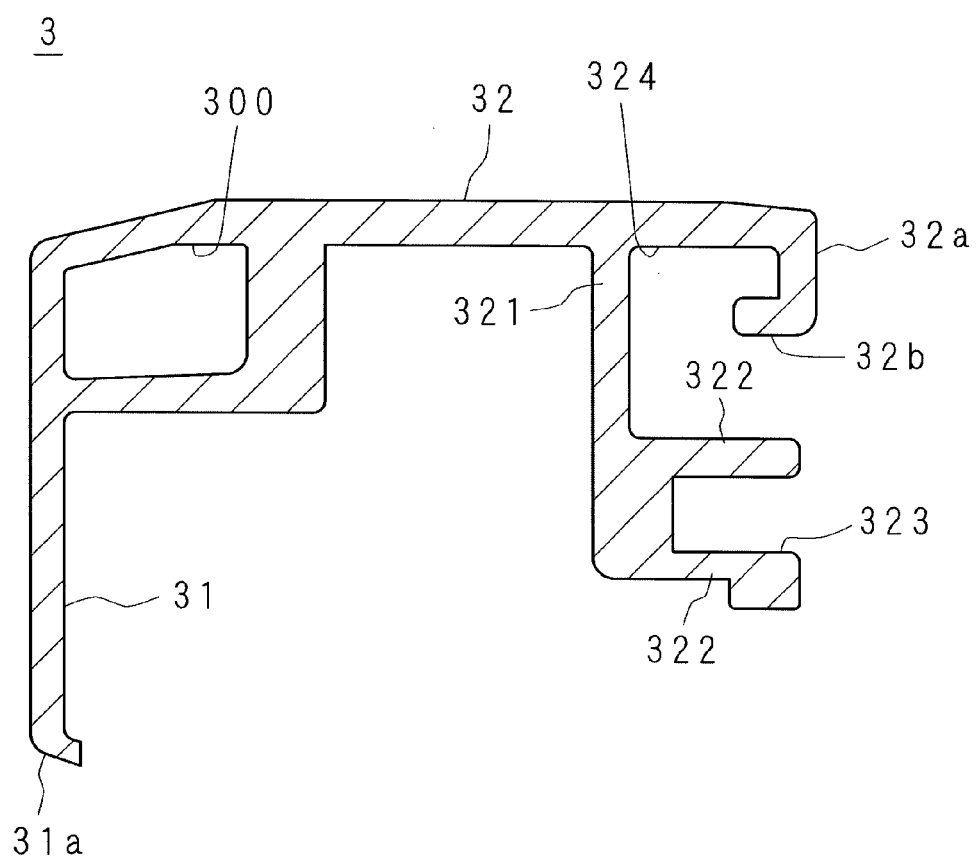
FIG. 7 is a cross-sectional view of one example of a front cabinet.

FIG. 7 is a cross-sectional view of one example of the front cabinet 3. FIG. 7 shows a part of the upper cross section of the front cabinet 3 cut in a plane substantially parallel to the normal line of the display surface 21 and the vertical direction.

The upper peripheral surface part 32 of the front cabinet 3 is formed in a hook shape with a rear end folded clockwise in FIG. 7 into a roll shape. The upper peripheral surface part 32 includes an upper rear surface part 32a which is bent downward from the rear end thereof and extends downward, and a hooking part 32b which is bent forward from the bottom end of the upper rear surface part 32a and extends forward. A protruding plate part 322 protruding rearward from the rear surface of the rib 321 is disposed below the hooking part 32b, and a peripheral surface groove 324 is formed between the peripheral the protruding plate part 322, and surface part 32 and the hooking part 32b.

Figure 8:
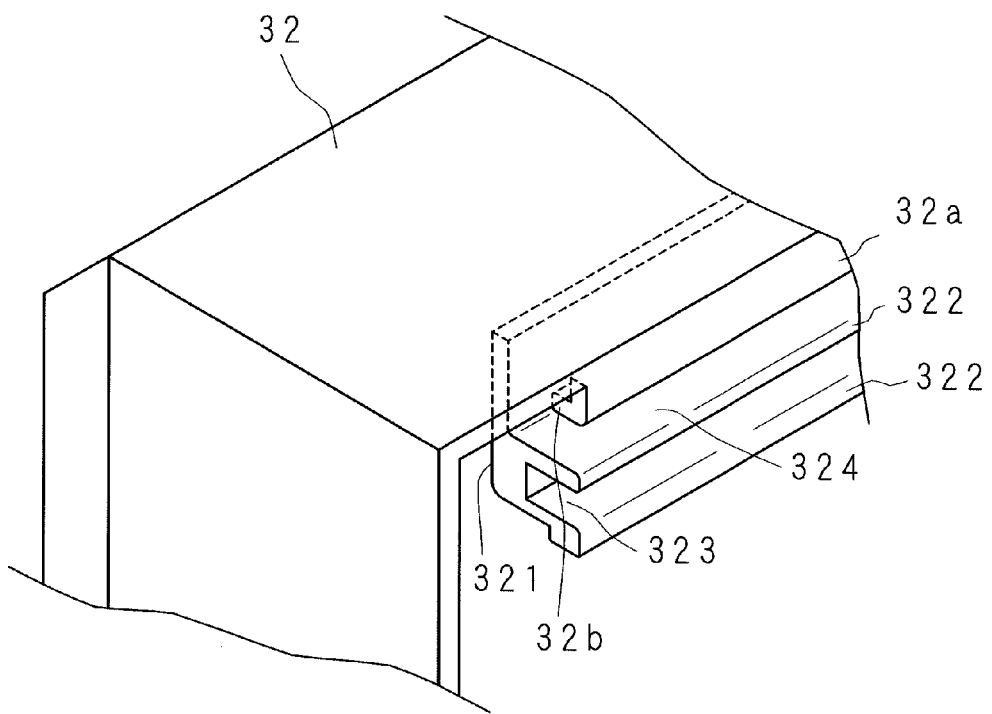
FIG. 8 is a partial perspective view showing a rear upper portion of the front cabinet as seen obliquely from the rear upper left.

FIG. 8 is a partial perspective view showing the rear upper portion of the front cabinet 3 as seen obliquely from the upper rear left. The upper peripheral surface part 32 provided with the upper rear surface part 32a and the hooking part 32b extends in the longitudinal direction of the front cabinet 3. The protruding plate part 322 in which the slit groove 323 is formed extends also in the longitudinal direction of the front cabinet 3. Therefore, the rear upper portion of the front cabinet 3, which includes the peripheral surface part 32, the upper rear surface part 32a, the hooking part 32b, the peripheral surface groove 324, the protruding plate part 322 and the slit groove 323, is formed in a complex rail shape.

The upper portion of the peripheral surface groove 324 is concealed by the upper rear surface part 32a as seen from the rear side. Therefore, the area of the opening of the peripheral surface groove 324 is narrower than the cross sectional area taken by cutting the middle of the rear end and the front end of the peripheral surface groove 324 in a plane parallel with the display surface 21. Because the hooking part 32b does not reach the inner depth side (the inner surface of the front end) of the peripheral surface groove 324, the volume of the gap occupied by the peripheral surface groove 324 has the inner side (the front side) thereof greater than the rear side thereof.

Further, in FIG. 8, the upper rear surface part 32a, the hooking part 32b and the protruding plate part 322 are cut near the corner, in order to clearly show the rear upper portion of the front cabinet 3. However, in reality, the upper rear surface part 32a, the hooking part 32b and the protruding plate part 322 extend to both sides of the peripheral surface part 32(see FIG. 6). Therefore, the front cabinet 3 is easily fabricated by extrusion molding despite the complex structure.

Figure 9:
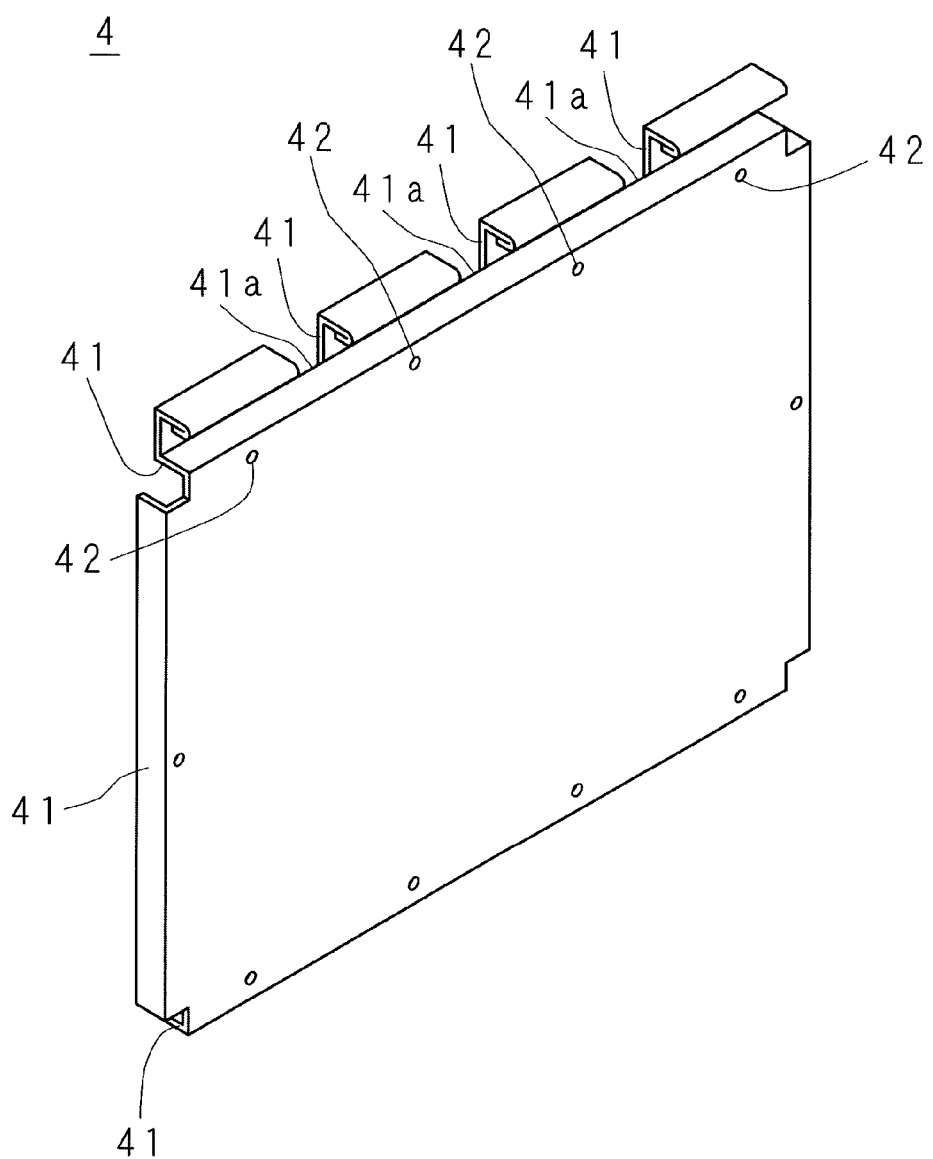
FIG. 9 is a schematic perspective view of a back cabinet.

FIG. 9 is a schematic perspective view of the back cabinet 4. FIG. 9 shows the back cabinet 4 as seen obliquely from the upper rear left. The back cabinet 4 is formed in a rectangular shape as seen from the rear face. The back cabinet 4 is provided with screw insert holes 42 which are formed in the peripheral edge part thereof to allow tapping screws 5 to be inserted therein. A tapping screw 5 is a coupling means which is tapped into the slit groove 323 of the front cabinet 3 to couple the front cabinet 3 and the back cabinet 4. In the example of FIG. 9, the back cabinet 4 is provided with four insert holes 42 respectively formed along the upper and lower long sides, and one screw insert hole 42 formed along each of the left and right short sides.

The back cabinet 4 is a plate-shaped member covering the display unit 2 and the outer peripheral edge part of the front cabinet 3. The back cabinet 4 is provided with extension parts 41 which are formed on the peripheral edge part thereof facing the peripheral surface groove 324 of the front cabinet 3 to extend forward along the peripheral surface groove 324. The extension parts 41 formed on the upper portion of the back cabinet 4 have a plurality of notches 41a. Therefore, a plurality of the extension parts 41 are divided by the notches 41a. In the example of FIG. 9, the extension parts 41 formed in the upper portion of the back cabinet 4 have three notches 41a, so that four divided extension parts 41 are provided. In the example of FIG. 9, the screw insert holes 42 arranged along the upper long side of the back cabinet 4 are formed such that there is one each at a position corresponding to the substantial center of each of the four extension parts 41.

The upper extension part 41 of the back cabinet 4 has a structure part formed so as to extend further upward and bend rearward.

Figure 10:
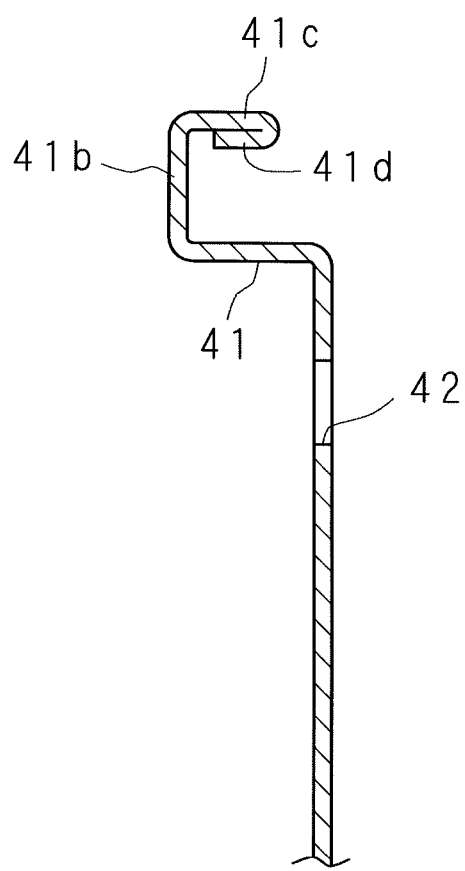
FIG. 10 is a cross-sectional view of one example of the back cabinet.

FIG. 10 is a cross-sectional view of one example of the back cabinet 4. FIG. 10 shows a part of the upper cross section of the back cabinet 4 cut in a plane substantially parallel to the normal line of the display surface 21 and the vertical direction.

The upper portion of the back cabinet 4 is formed in a hook shape with the forward protruding extension part 41 folded clockwise in FIG. 10 into a roll shape. Alternatively, in the cross section of FIG. 10, the upper portion of the back cabinet 4 is ladle-shaped. The dipper portion of the ladle is positioned on the upper side, and the handle portion is positioned on the lower side.

The upper portion of the back cabinet 4 includes an upper extension part 41b bent upward from the front end of the extension part 41 and extending upward and a locking part 41c bent rearward at the top end of the upper extension part 41b and extending rearward. The extension part 41 and the locking part 41c extend rearward respectively from the bottom end and top end of the upper extension part 41b, and the extending directions are substantially identical. The extension part 41 and the locking part 41c have a positional relation facing each other. If the lengths of the extension part 41 and the locking part 41c extending rearward from the upper extension part 41b are compared, that of the extension part 41 is longer than the locking part 41c. Therefore, in FIGS. 9 and 10, the tip end of the locking part 41c is positioned forward from the peripheral edge part of the back cabinet 4 in which the screw insert hole 42 is formed.

Further, the difference in the length of the extension part 41 and the locking part 41c in a front-back direction is substantially equal to the thickness of the upper rear surface part 32a in the front cabinet 3. Alternatively, the tip end of the locking part 41c is located forward from the peripheral edge part of the back cabinet 4 to the amount of a size corresponding to the thickness of the upper rear surface part 32a in the front cabinet 3. Thus, when the back cabinet 4 is mounted on the front cabinet 3, the rear surface of the television receiver 1 becomes flat, thus it is configured so as to have the aesthetics thereof maintained.

The locking part 41c has a locking bent part 41d formed with its tip end folded substantially 180 degrees downward. Therefore, the thickness obtained by adding the thickness of the rear end portion of the locking part 41c and the thickness of the locking bent part 41d is thicker than that of the other portion of the back cabinet 4.

The locking bent part 41*d* is formed to be roundish so as to prevent one from being hurt when he or she comes into contact with the rear tip of the locking part 41*c*.

Further, if safety during assembly work is secured, the locking bent part 41*d* may be dispensable. For example, if the tip end of the locking part 41*c* is molded into a roundish shape, the locking bent part 41*d* may be dispensable.

Figure 11:
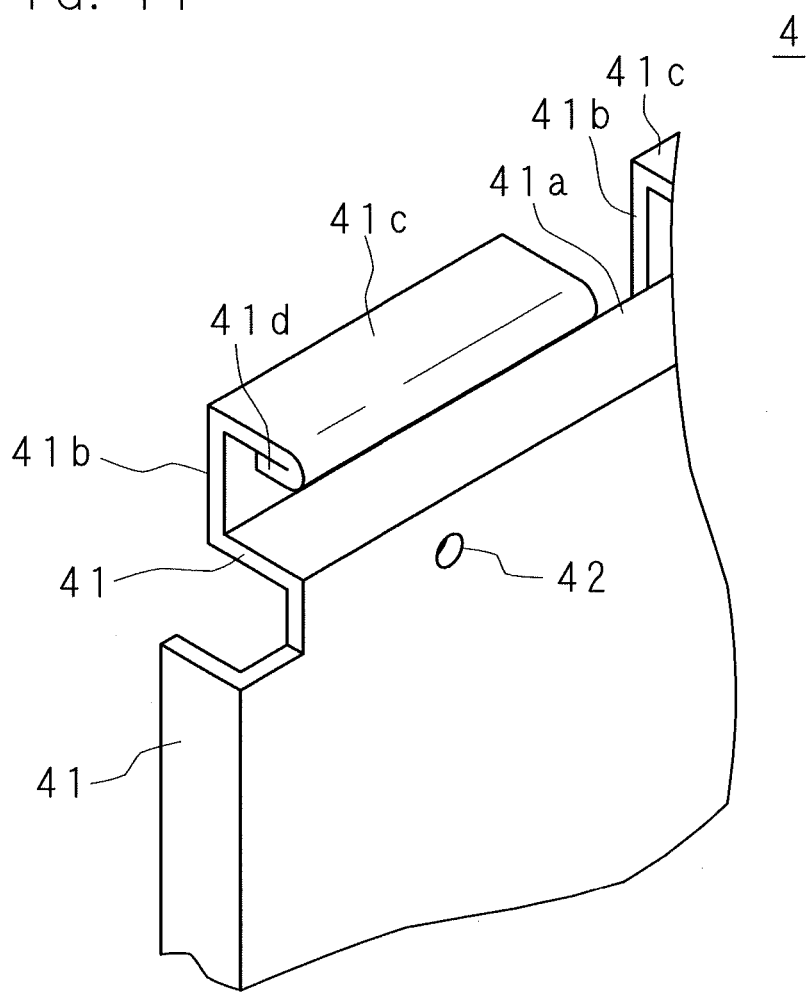
FIG. 11 is a partial perspective view showing the rear upper portion of the back cabinet as seen obliquely from the rear upper left.

FIG. 11 is a partial perspective view showing the rear upper portion of the back cabinet 4 as seen obliquely from the rear upper left.

The above-described extension part 41, upper extension part 41*b*, locking part 41*c* and locking bent part 41*d* extend in the long side direction of the back cabinet 4. Therefore, the upper portion of the back cabinet 4 including the extension part 41, the upper extension part 41*b*, the locking part 41*c* and the locking bent part 41*d* is formed in a rail shape having the notch 41*a*.

Figure 12:
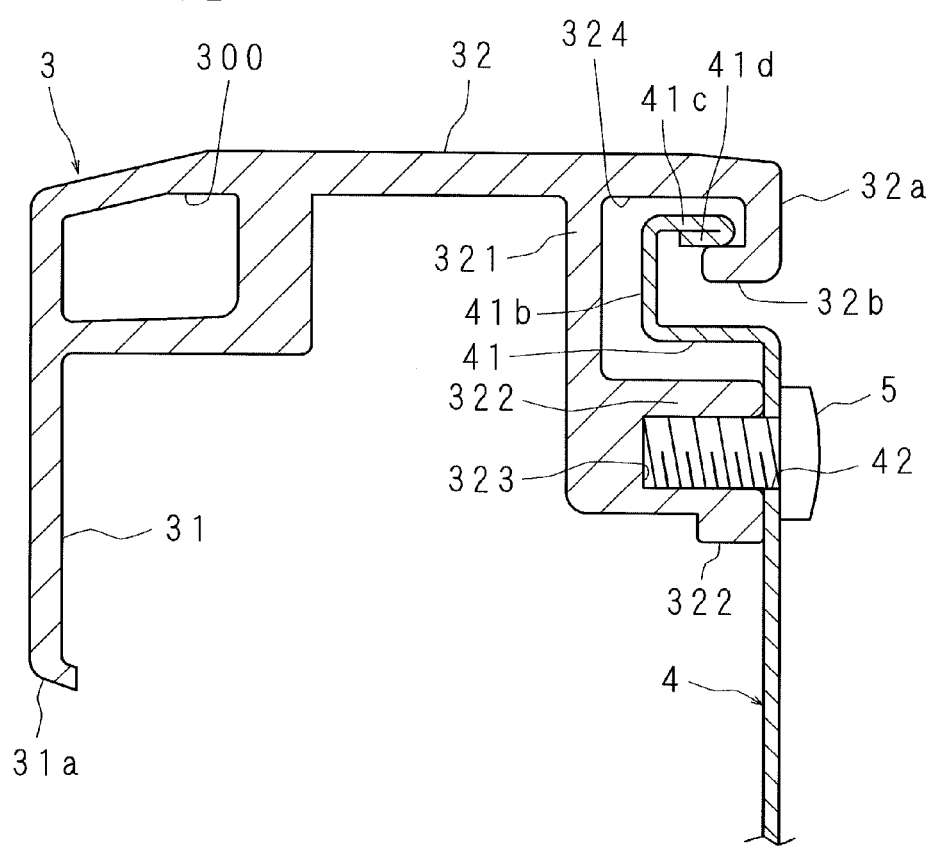
FIG. 12 is a cross-sectional view of one example of the front cabinet and the back cabinet in a coupled state.

FIG. 12 is a cross-sectional view of one example of the front cabinet 3 and the back cabinet 4 in a coupled state. FIG. 12 shows a part of the upper cross section of the front cabinet 3 and the back cabinet 4 cut in a plane substantially parallel to the normal line of the display surface 21 and the vertical direction.

The extension part 41 of the back cabinet 4, the upper extension part 41*b*, the locking part 41*c* and the locking bent part 41*d* are inserted into the bent peripheral surface groove 324 of the front cabinet 3. That is, the front cabinet 3 and the back cabinet 4 are coupled such that the hook structure formed on the upper portion of the back cabinet 4 and the hook structure formed on the upper portion of the front cabinet 3 are alternately and threadedly engaged or locked with each other. In addition, the locking part 41*c* and the locking bent part 41*d* of the back cabinet 4 are locked to the hooking part 32*b* of the front cabinet 3. Therefore, the back cabinet 4 is in a state suspended from the front cabinet 3. In FIG. 12, the front cabinet 3 and the back cabinet 4 are coupled further by fastening of the tapping screw 5.

The front cabinet 3 and the back cabinet 4 may be made of metal or resin. When using metal, the front cabinet 3 or the back cabinet 4 may be made of aluminum, iron, copper, etc., for example. The members composing the front cabinet 3 (for example, the peripheral surface part 32, the upper rear surface part 32*a* and the hooking part 32*b*) may be formed by extrusion molding, for example. When the back cabinet 4 is made of metal, it may be formed by pressing, for example. When the front cabinet 3 or the back cabinet 4 is made of iron, copper, or the like, electrogalvanizing, for example, may be conducted in view of corrosion resistance, aesthetics or the like.

Next, a part of the assembling method for the television receiver 1 will be described.

Figure 13A:
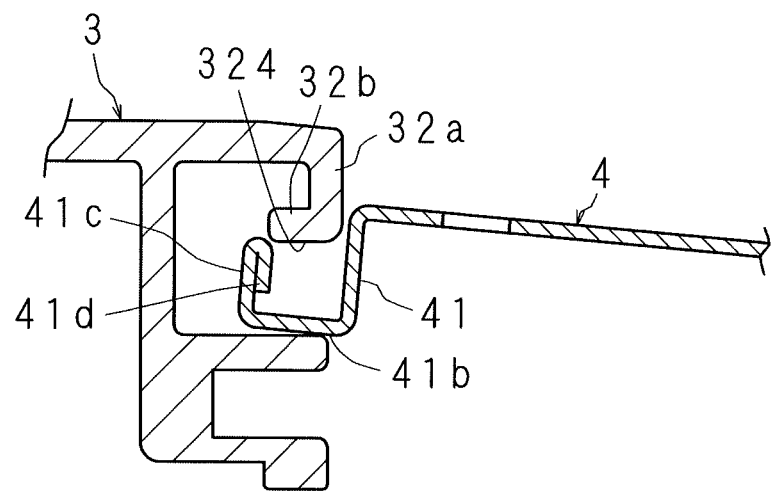
FIG. 13A is a view illustrating the pre-stage of a mounting process.
Figure 13B:
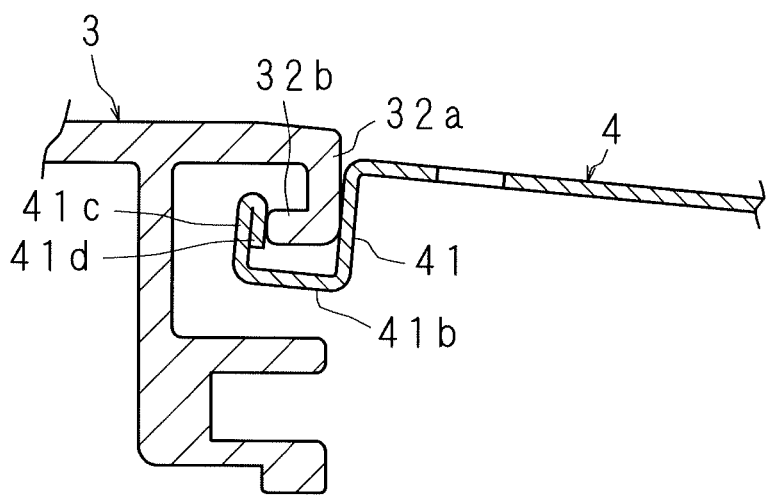
FIG. 13B is a view illustrating the intermediate stage of the mounting process.
Figure 13C:
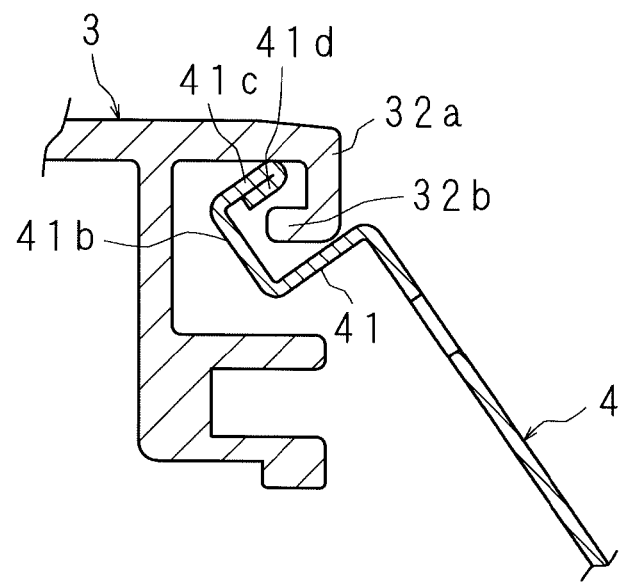
FIG. 13C is a view illustrating the intermediate stage of the mounting process.
Figure 13D:
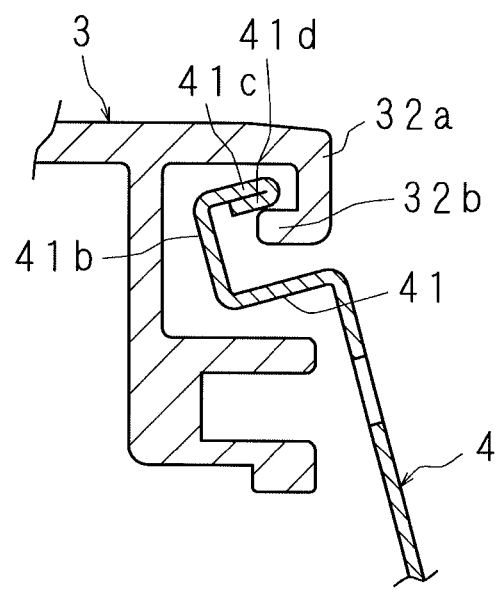
FIG. 13D is a view illustrating the latter half stage of the mounting process.

FIG. 13A is a view illustrating the pre-stage of a mounting process. FIGS. 13B and 13C are views illustrating the intermediate stage of the mounting process. FIG. 13D is a view illustrating the latter half stage of the mounting process. Further, FIG. 12 shown previously shows the completion stage of the mounting process.

The front cabinet 3 with the display unit 2 mounted thereon is made to be in a standing state. The back cabinet 4 is held with both hands such that the lower side of the back cabinet 4 is located near a worker and the upper side (the side where the upper extension part 41*b* is formed) is located far from the worker. Further, the back cabinet 4 is held with both hands such that the exterior flat part of the back cabinet 4 covering the display unit 2 faces upward and is substantially horizontal. The center of the back cabinet 4 is made to approach the upper center of the front cabinet 3 from the rear side of the front cabinet 3. That is, the top and bottom positions and the left and right positions of the back cabinet 4 with respect to the front cabinet 3 are roughly aligned.

With the flat part of the back cabinet 4 maintained substantially horizontal, the locking part 41*c* and the locking bent part 41*d* of the back cabinet 4 are inserted slowly into the lower peripheral surface groove 324 of the upper rear surface part 32*a* of the front cabinet 3 (FIG. 13A).

When the locking part 41*c* and the locking bent part 41*d* are inserted into the peripheral surface groove 324 of the side (the front side) inner than the front end of the hooking part 32*b*, the back cabinet 4 is lifted slightly so that the hooking part 32*b* can be positioned between the extension part 41 and the locking part 41*c*. Then, the back cabinet 4 is rotated so that the locking part 41*c* and the locking bent part 41*d* are locked to the hooking part 32*b* (FIGS. 13B, 13C and 13D). A rotation axis here is substantially parallel to the long side of the back cabinet 4, and the axis passing through the zone between the extension part 41 and the locking part 41*c* is to be the rotation axis. Further, the rotation direction here is the direction in which the near side end of the back cabinet 4 held with both hands approaches the lower portion of the front cabinet 3. Alternatively, the rotation direction here is clockwise in FIGS. 13B, 13C and 13D.

In the latter half stage of the mounting process (FIG. 13D), the back cabinet 4 may be rotated so that the front end of the locking part 41*c* and the locking bent part 41*d* abut the front side (a back side) of the upper rear surface part 32*a*. When the locking part 41*c* and the locking bent part 41*d* are locked to the hooking part 32*b*, the back cabinet 4 comes to be suspended from the front cabinet 3, and the temporary fixing of the back cabinet 4 to the front cabinet 3 is completed (FIG. 12). At this time, the positioning of the back cabinet 4 in relation to the front cabinet 3 is completed relative to a vertical direction and a horizontal direction.

The extension parts 41 formed on the lower portion and the lateral portion of the back cabinet 4 are inserted into the peripheral surface groove 324 of the front cabinet 3 facing these parts. The tapping screw 5 is inserted into the screw insert hole 42 formed on the peripheral edge part of the back cabinet 4, and the inserted tapping screw 5 is screwed to the slit groove 323 of the front cabinet 3 to fix the back cabinet 4 to the front cabinet 3.

According to the television receiver 1, the back cabinet 4 can be temporarily fixed to the front cabinet 3, when mounting the back cabinet 4 on the front cabinet 3 or the display unit 2.

By temporarily fixing the back cabinet 4 to the front cabinet 3, the positioning relative to the vertical direction of the back cabinet 4 for the front cabinet 3 is completed. Further, the positioning relative to the lateral direction of left and right is also completed.

Conventionally, when mounting the back cabinet 4 on the front cabinet 3 or the display unit 2, the worker is required to do fastening work such as screw fixing, with the back cabinet 4 pressed against the front cabinet 3 or the display unit 2. However, the back cabinet 4 of the television receiver 1 is temporarily fixed to the front cabinet 3 by the hooking part 32*b*, the locking part 41*c* and the locking bent part 41*d*. Therefore, the worker can carry out fastening work such as screw fixing, without pressing the back cabinet 4 by hand and without doing positioning work. Therefore, the structure in which the back cabinet 4 is suspended from the front cabinet 3 can improve the assembly work efficiency for the television receiver 1.

According to the television receiver 1, the assembly work of the television receiver 1 is performed with the display surface 21 standing upright substantially parallel to the vertical direction. Therefore, the area of the floor on which the television receiver 1 is placed may be narrower than the floor area when assembling with the front cabinet 3 placed on a horizontal surface. Therefore, the television receiver 1 can reduce the space requirements of the assembly workplace.

The notches 41a are formed in the extension part 41, the upper extension part 41b, the locking part 41c and the locking bent part 41d of the back cabinet 4, but the notches may also be formed in the hooking part 32b of the front cabinet 3 facing the notches 41a. Thus, it is possible to reduce the material requirements of the notch part with regard to the front cabinet 3 and the back cabinet 4.

In FIG. 12, a gap is formed between the upper rear surface part 32a of the front cabinet 3 and the extension part 41 of the back cabinet 4. This gap may be filled with a filling member.

When mounting the back cabinet 4 on the front cabinet 3, the extension part 41, the upper extension part 41b, the locking part 41c and the locking bent part 41d of the back cabinet 4 rotate inside the peripheral surface groove 324. Therefore, a gap having clearance is formed between the locking part 41c and the locking bent part 41d, and the extension part 41. As a result, after the back cabinet 4 is mounted on the front cabinet 3, a gap is formed between the upper rear surface part 32a of the front cabinet 3 and the extension part 41 of the back cabinet 4. If the aesthetic appearance is affected by this gap (a three-dimensional groove), the gap may be filled with a filling member to ensure that the rear surface of the television receiver 1 becomes flat, such that the aesthetic appearance is not deteriorated.

Embodiment 3 is as described above, and other than that is the same as embodiments 1 and 2, such that the corresponding parts have the same reference numbers, and a detailed description, actions and effects thereof will be omitted.

As this invention may be embodied in several forms without departing from the sprit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A display device, comprising:
   a display unit having a display surface on a front side of the display unit;
   a front cabinet enclosing a peripheral edge part of the display unit; and
   a back cabinet covering a back side of the display unit,
   wherein the front cabinet includes:
      a front surface part covering the peripheral edge part of the display surface,
      a peripheral surface part which is formed on a rear side of the front surface part arround an outer peripheral edge of the front surface part to enclose an outer peripheral surface of the display unit, and
      a protruding plate part located on an inside of the peripheral surface part, which is isolated from the peripheral surface part, and protrudes rearward from the front cabinet along a part or all of the peripheral surface part,
   the back cabinet includes:
      a screw insert hole which faces between the peripheral surface part and the protruding plate part or a tip surface of the protruding plate part, and
      an extension part which faces an area between the peripheral surface part and the protruding plate part and extends forward; and
   the front cabinet and the back cabinet are coupled by fastening of a tapping screw which is inserted into the screw insertion hole from the rear side and tapped and screwed to the peripheral surface part and the protruding plate part or the tip surface of the protruding plate part, and by fitting of the extension part to a gap between the peripheral surface part and the protruding plate part.

2. The display device according to claim 1,
wherein the protruding plate part includes:
   a groove formed on the tip surface of the protruding plate part, the groove being substantially parallel to a tip of the peripheral surface part, and
the front cabinet and the back cabinet are coupled by fastening of a tapping screw which is screwed to the groove of the protruding plate part.

3. The display device according to claim 1,
wherein the front cabinet includes:
a rib which protrudes inward from an inner surface of the peripheral surface part, and
the protruding plate part protrudes from a rear surface of the rib.

4. The display device according to claim 1,
wherein the protruding plate part is so formed as to protrude between the peripheral surface part and the display unit from a rear surface of the front surface part.

5. The display device according to claim 1,
wherein the extension part extends forward from an outer peripheral part of the back cabinet.

6. The display device according to claim 1, wherein the extension part is formed around a part or all of the outer peripheral part of the back cabinet.

7. The display device according to claim 1, wherein the front cabinet is formed by extrusion molding.

8. A television receiver comprising:
the display device according to claim 1; and
a receiving unit which receives television broadcasting,
wherein the display device displays a video image of the television broadcasting received by the receiving unit.

* * * * *